(12) United States Patent
Long

(10) Patent No.: US 12,159,874 B2
(45) Date of Patent: Dec. 3, 2024

(54) ARRAY SUBSTRATE AND DISPLAY PANEL

(71) Applicant: WUHAN CHINA STAR OPTOELECTRONICS TECHNOLOGY CO., LTD., Wuhan (CN)

(72) Inventor: Shiyu Long, Wuhan (CN)

(73) Assignee: WUHAN CHINA STAR OPTOELECTRONICS TECHNOLOGY CO., LTD., Wuhan (CN)

( * ) Notice: Subject to any disclaimer, the term of this patent is extended or adjusted under 35 U.S.C. 154(b) by 0 days.

(21) Appl. No.: 17/635,804

(22) PCT Filed: Feb. 8, 2022

(86) PCT No.: PCT/CN2022/075465
§ 371 (c)(1),
(2) Date: Feb. 16, 2022

(87) PCT Pub. No.: WO2023/142157
PCT Pub. Date: Aug. 3, 2023

(65) Prior Publication Data
US 2024/0038767 A1 Feb. 1, 2024

(30) Foreign Application Priority Data
Jan. 26, 2022 (CN) .......................... 202210091034.0

(51) Int. Cl.
*H01L 27/12* (2006.01)
*G02F 1/1333* (2006.01)
(Continued)

(52) U.S. Cl.
CPC ................ *H01L 27/1218* (2013.01)

(58) Field of Classification Search
CPC ............ H01L 27/124; H01L 27/1248; H01L 27/1218; G02F 1/133357; G02F 1/136227
See application file for complete search history.

(56) References Cited

U.S. PATENT DOCUMENTS

| 2005/0116240 A1 | 6/2005 | Kim et al. |
| 2010/0109132 A1* | 5/2010 | Ko ......................... H01L 21/561 |
| | | 257/E23.114 |

(Continued)

FOREIGN PATENT DOCUMENTS

| CN | 1622699 A | 6/2005 |
| CN | 105702623 A | 6/2016 |

(Continued)

OTHER PUBLICATIONS

PCT International Search Report for International Application No. PCT/CN2022/075465, mailed on Oct. 26, 2022, 8pp.

(Continued)

*Primary Examiner* — Mohsen Ahmadi
(74) *Attorney, Agent, or Firm* — The Roy Gross Law Firm, LLC; Roy Gross

(57) ABSTRACT

An array substrate includes a first substrate and a planarization layer disposed on a side of the first substrate. The planarization layer is provided with a first through hole. A cross-sectional area of the first through hole gradually decreases in a direction from the planarization layer toward the first substrate. An angle between a sidewall of the first through hole and a bottom surface of the first through hole is 50° to 90°.

16 Claims, 6 Drawing Sheets

(51) Int. Cl.
*G02F 1/1362* (2006.01)
*G09F 9/33* (2006.01)

(56) References Cited

U.S. PATENT DOCUMENTS

| | | | |
|---|---|---|---|
| 2016/0018687 A1 | 1/2016 | Chung et al. | |
| 2017/0179420 A1 | 6/2017 | Lee et al. | |
| 2018/0069062 A1* | 3/2018 | Ma | H10K 59/122 |
| 2018/0097087 A1* | 4/2018 | Sun | G02F 1/136227 |
| 2020/0373333 A1* | 11/2020 | Liang | H01L 27/124 |
| 2022/0310730 A1* | 9/2022 | Zhao | H01L 27/1259 |

FOREIGN PATENT DOCUMENTS

| | | | |
|---|---|---|---|
| CN | 105895581 | A | 8/2016 |
| CN | 106024807 | A | 10/2016 |
| CN | 108132567 | A | 6/2018 |
| CN | 108538856 | A | 9/2018 |
| CN | 109410757 | A | 3/2019 |
| CN | 110456582 | A | 11/2019 |
| CN | 110600482 | A | 12/2019 |
| CN | 111584581 | A | 8/2020 |
| CN | 112181196 | A | 1/2021 |
| CN | 113113429 | A | 7/2021 |
| CN | 115241208 | A | 10/2022 |
| JP | 2022016320 | A | 1/2022 |

OTHER PUBLICATIONS

PCT Written Opinion of the International Searching Authority for International Application No. PCT/CN2022/075465, mailed on Oct. 26, 2022, 7pp.

Chinese Office Action issued in corresponding Chinese Patent Application No. 202210091034.0 dated Apr. 14, 2023, pp. 1-8, 20pp.

Chinese Office Action issued in corresponding Chinese Patent Application No. 202210091034.0 dated Jun. 30, 2023, pp. 1-5, 13pp.

* cited by examiner

ARRAY SUBSTRATE AND DISPLAY PANEL

CROSS REFERENCE TO RELATED APPLICATIONS

This application is a National Phase of PCT Patent Application No. PCT/CN2022/075465 having International filing date of Feb. 8, 2022, which claims the benefit of priority of Chinese Application No. 202210091034.0 filed on Jan. 26, 2022. The contents of the above applications are all incorporated by reference as if fully set forth herein in their entirety.

FIELD OF INVENTION

The present disclosure relates to the technical field of display, and particularly to an array substrate and a display panel.

BACKGROUND

With the development of display technology, display devices have been widely used in various fields in people's lives, and types of display devices have become more and more. Currently, commonly used display devices include liquid crystal displays (LCD), organic light-emitting diode (OLED) display panels, and active-matrix organic light-emitting diode (AMOLED) panels.

In a production process of a current display screen in the industry, a planarization layer is usually made of a planarization (PLN) material. In the prior art, through holes are formed in the planarization layer by exposing and developing. However, in a manufacturing process, due to a limitation of a material of the planarization layer itself, a taper angle of the through holes is small, and two opposite sides of each of the through holes are arc-shaped. Therefore, an area occupied by the through holes in the planarization layer is larger, so that an area of pixels is smaller, which reduces an aperture ratio of the display screen.

SUMMARY OF DISCLOSURE

The present disclosure provides an array substrate and a display panel to solve deficiencies in the related art.

In order to achieve the above effect, the present disclosure provides an array substrate comprising:
   a first substrate; and
   a planarization layer disposed on a side of the first substrate and provided with a first through hole, wherein a cross-sectional area of the first through hole gradually decreases in a direction from the planarization layer toward the first substrate, and an angle between a sidewall of the first through hole and a bottom surface of the first through hole is 50° to 90°.

In an embodiment, an angle between the sidewall of the first through hole and a side surface of the planarization layer away from the first substrate is 90° to 130°.

In an embodiment, the sidewall of the first through hole comprises a first portion. In a direction perpendicular to the first substrate, a cross-section of the first portion is a straight line.

In an embodiment, in a direction perpendicular to the first substrate, a cross-section of the sidewall of the first through hole is a straight line.

In an embodiment, the first through hole comprises a first opening away from the first substrate, and a second opening close to the first substrate. A ratio of a maximum width of the first opening to a maximum width of the second opening is M:N, where M is 2 to 3, and N is 3 to 4.5.

In an embodiment, in a direction perpendicular to the first substrate, the maximum width of the first opening is 2 μm to 8 μm, and the maximum width of the second opening is 1.5 μm to 6 μm.

In an embodiment, the array substrate further comprises a support area. An orthographic projection of the first through hole on the first substrate is located outside the support area.

In an embodiment, the array substrate further comprises a passivation layer disposed on a side of the planarization layer away from the first substrate and provided with a second through hole communicating with the first through hole. An angle between a sidewall of the second through hole and the first substrate is 50° to 90°.

In an embodiment, the angle between the sidewall of the second through hole and the first substrate is equal to an angle between the sidewall of the first through hole and the first substrate.

In an embodiment, a sum of a depth of the first through hole and a depth of the second through hole is 1 μm to 2.5 μm.

In an embodiment, the array substrate further comprises an electrode layer covering the sidewall of the second through hole, the sidewall of the first through hole, and the bottom surface of the first through hole.

The present disclosure further provides a display panel comprising an array substrate. The array substrate comprises:
   a first substrate; and
   a planarization layer disposed on a side of the first substrate and provided with a first through hole, wherein a cross-sectional area of the first through hole gradually decreases in a direction from the planarization layer toward the first substrate, and an angle between a sidewall of the first through hole and a bottom surface of the first through hole is 50° to 90°.

In an embodiment, an angle between the sidewall of the first through hole and a side surface of the planarization layer away from the first substrate is 90° to 130°.

In an embodiment, the sidewall of the first through hole comprises a first portion. In a direction perpendicular to the first substrate, a cross-section of the first portion is a straight line.

In an embodiment, in a direction perpendicular to the first substrate, a cross-section of the sidewall of the first through hole is a straight line.

In an embodiment, the first through hole comprises a first opening away from the first substrate, and a second opening close to the first substrate. A ratio of a maximum width of the first opening to a maximum width of the second opening is M:N, where M is 2 to 3, and N is 3 to 4.5.

In an embodiment, in a direction perpendicular to the first substrate, the maximum width of the first opening is 2 μm to 8 μm, and the maximum width of the second opening is 1.5 μm to 6 μm.

In an embodiment, the array substrate further comprises a support area. An orthographic projection of the first through hole on the first substrate is located outside the support area.

In an embodiment, the array substrate further comprises a passivation layer disposed on a side of the planarization layer away from the first substrate and provided with a second through hole communicating with the first through hole. An angle between a sidewall of the second through hole and the first substrate is 50° to 90°.

In an embodiment, the angle between the sidewall of the second through hole and the first substrate is equal to an angle between the sidewall of the first through hole and the first substrate.

The present disclosure provides an array substrate and a display panel including the same. The array substrate includes a first substrate and a planarization layer disposed on a side of the first substrate. The planarization layer is provided with a first through hole. In the present disclosure, a cross-sectional area of the first through hole gradually decreases in a direction from the planarization layer toward the first substrate, and an angle between a sidewall of the first through hole and a bottom surface of the first through hole is 50° to 90°, thereby reducing an area occupied by the first through hole in the planarization layer and increasing an aperture ratio of the display panel.

BRIEF DESCRIPTION OF DRAWINGS

Specific implementation of the present disclosure will be described in detail below in conjunction with accompanying drawings to make technical solutions and beneficial effects of the present disclosure obvious.

DETAILED DESCRIPTION

The present disclosure provides an array substrate and a display panel. In order to make purposes, technical solutions, and effects of the present invention clearer and more definite, the present invention will be further described in detail below with reference to accompanying drawings and embodiments. It should be understood that specific embodiments described herein are only used to explain the present invention, not used to limit the present invention.

Figure 1:
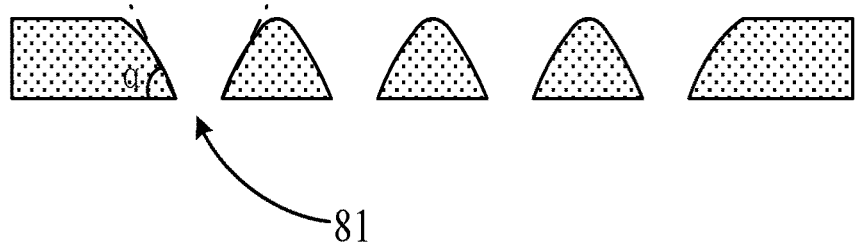
FIG. 1 is a schematic cross-sectional view of a planarization layer of an array substrate in the prior art.

Please refer to FIG. 1, which is a schematic cross-sectional view of a planarization layer of an array substrate in the prior art.

In the prior art, in the industry, a planarization layer 80 is usually made of a planarization (PLN) material, and a plurality of first through holes 81 are formed in the planarization layer 80 by exposing and developing. However, in a manufacturing process, due to a limitation of the material of the planarization layer 80 itself, a taper angle α of the first through holes 81 is small, and two opposite sides of each of the first through holes 81 are arc-shaped. Therefore, an area occupied by the first through holes 81 in the planarization layer 80 is larger, so that an area of pixels is smaller, which reduces an aperture ratio of a display product. Based on this, the present disclosure provides an array substrate and a display panel to improve an aperture ratio of the display panel.

Please refer to FIG. 2 to FIG. 7E. The present disclosure provides an array substrate 1 and a display panel including the same. The array substrate 1 includes a first substrate 10 and a planarization layer 80 disposed on a side of the first substrate 10. The planarization layer 80 is provided with a plurality of first through holes 81. A cross-sectional area of each of the first through holes 81 gradually decreases in a direction from the planarization layer 80 toward the first substrate 10. An angle β between a sidewall of each of the first through holes 81 and the first substrate 10 is 50° to 90°.

It can be understood that in the present disclosure, the cross-sectional area of each of the first through holes 81 is set to gradually decrease in the direction from the planarization layer 80 toward the first substrate 10, and the angle β between the sidewall of each of the first through holes 81 and the first substrate 10 is set to be 50° to 90°, thereby reducing an area occupied by the first through holes 81 in the planarization layer 80 and increasing an aperture ratio of the display panel.

Technical solutions of the present disclosure will now be described with reference to specific embodiments.

Figure 2:
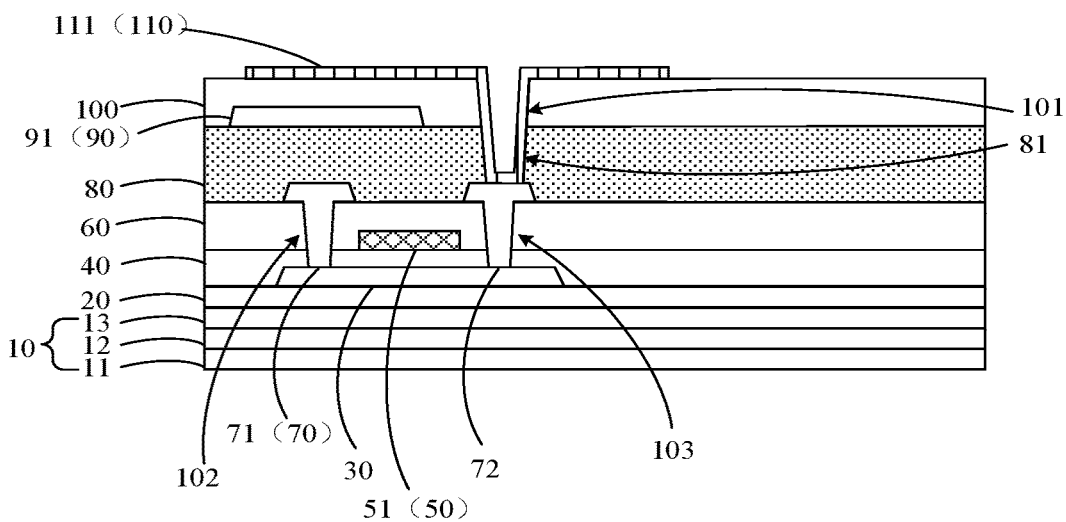
FIG. 2 is a schematic cross-sectional view of an array substrate according to an embodiment of the present disclosure.
Figure 3:
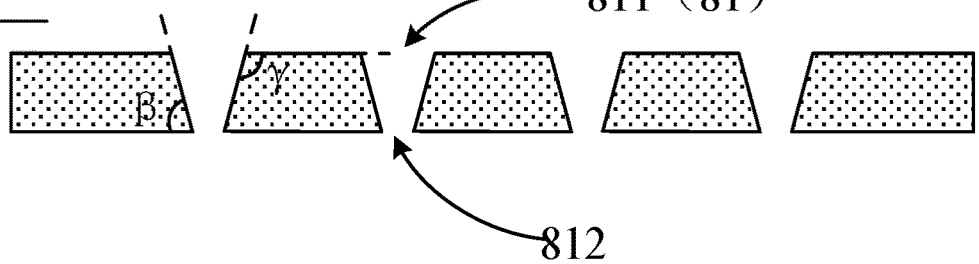
FIG. 3 is a schematic cross-sectional view of a planarization layer of the array substrate according to an embodiment of the present disclosure.

Please refer to FIG. 2 and FIG. 3. FIG. 2 is a schematic cross-sectional view of an array substrate according to an embodiment of the present disclosure. FIG. 3 is a schematic cross-sectional view of a planarization layer of the array substrate according to an embodiment of the present disclosure.

This embodiment provides an array substrate 1. The array substrate 1 includes a first substrate 10, and a buffer layer 20, an active layer 30, a gate insulating layer 40, a first metal layer 50, an interlayer insulating layer 60, a second metal layer 70, a planarization layer 80, a first electrode layer 90, a passivation layer 100, and a second electrode layer 110 that are sequentially stacked on a side of the first substrate 10.

The first substrate 10 includes a first base substrate 11, a spacer layer 12, and a second base substrate 13 that are stacked in sequence. The first base substrate 11 and the second base substrate 13 may be rigid substrates or flexible substrates. When both the first base substrate 11 and the second base substrate 13 are rigid substrates, they may be made of metal or glass. When both the first base substrate 11 and the second base substrate 13 are flexible substrates, they may be made of at least one of acrylic resin, methacrylic resin, polyisoprene, vinyl resin, epoxy resin, polyurethane resin, cellulose resin, siloxane resin, polyimide resin, and polyamide resin. The spacer layer 12 may be made of, but is not limited to, silicon nitride ($SiN_x$), silicon oxide ($SiO_x$), and other water-absorbing materials. In this embodiment, materials of the first base substrate 11, the second base substrate 13, and the spacer layer 12 are not limited.

The active layer 30 may be, but is not limited to, a polysilicon active layer or an oxide active layer. The first metal layer 50 and the second metal layer 70 may be made of at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), and tungsten (W). The second metal layer 70 is electrically connected to the active layer 30. In this embodiment, a type of the active layer 30 and materials of the first metal layer 50 and the second metal layer 70 are not specifically limited.

Specifically, in this embodiment, the first metal layer 50 includes, but is not limited to, a gate electrode 51. The second metal layer 70 includes a source electrode 71 and a drain electrode 72. Furthermore, the array substrate 1 is provided with a first via hole 102 and a second via hole 103 penetrating the gate insulating layer 40 and the interlayer insulating layer 60. The second metal layer 70 is connected to the active layer 30 through the first via hole 102 and the second via hole 103 to form the source electrode 71 and the drain electrode 72.

In this embodiment, the first electrode layer 90 and the second electrode layer 110 are made of, but are not limited to, indium tin oxide. The first electrode layer 90 includes, but is not limited to, a common electrode 91. The second electrode layer 110 includes, but is not limited to, a pixel electrode 111.

It should be noted that in this embodiment, the array substrate 1 includes the first substrate 10, and the buffer layer 20, the active layer 30, the gate insulating layer 40, the first metal layer 50, the interlayer insulating layer 60, the second metal layer 70, the planarization layer 80, the first electrode layer 90, the passivation layer 100, and the second electrode layer 110 that are sequentially stacked on the side of the first substrate 10, which is only an example. In this embodiment, a layer structure of the array substrate 1 is not specifically limited.

In this embodiment, the planarization layer 80 is provided with a first through hole 81. The pixel electrode 111 is electrically connected to the drain electrode 72 through the first through hole 81. A cross-sectional area of the first through hole 81 gradually decreases in a direction from the planarization layer 80 toward the first substrate 10, and an angle β between a sidewall of the first through hole 81 and a bottom surface of the first through hole 81 is 50° to 90°. The bottom surface of the first through hole 81 is a side surface of the first through hole 81 close to the first substrate 10.

Specifically, in this embodiment, an angle γ between the sidewall of the first through hole 81 and a side surface of the planarization layer 80 away from the first substrate 10 is 90° to 130°. It can be understood that in this embodiment, by setting the angle β between the sidewall of the first through hole 81 and the first substrate 10 to be 50° to 90°, and setting the angle γ between the sidewall of the first through hole 81 and the side surface of the planarization layer 80 away from the first substrate 10 to be 90° to 130°, sizes of openings of the first through hole 81 are reduced, thereby reducing an area occupied by the first through hole 81 in the planarization layer 80.

It should be noted that in an embodiment, the sidewall of the first through hole 81 includes a first portion (not shown). In a direction perpendicular to the first substrate 10, a cross-section of the first portion is a straight line. Specifically, the first portion is connected with the side surface of the planarization layer 80 away from the first substrate 10, and a portion of the planarization layer 80 connected with the first portion is a straight line. Further, in an embodiment, in the direction perpendicular to the first substrate 10, a cross-section of the sidewall of the first through hole 81 is a straight line.

Furthermore, the sidewall of the first through hole 81 further includes other portions. In the direction perpendicular to the first substrate 10, a cross-section of the other portions may be a straight line or an arc, which is not specifically limited in this embodiment. It can be understood that the first portion is connected with the side surface of the planarization layer 80 away from the first substrate 10, and the portion of the planarization layer 80 connected with the first portion is a straight line, which is only an example. In another embodiment, a part of the first portion connected with the side surface of the planarization layer 80 away from the first substrate 10 may be an arc, which is not specifically limited in this embodiment.

In this embodiment, the first through hole 81 includes a first opening 811 away from the first substrate 10, and a second opening 812 close to the first substrate 10. A ratio of a maximum width of the first opening 811 to a maximum width of the second opening 812 is M:N, where M is 2 to 3, and N is 3 to 4.5. Specifically, the maximum width of the first opening 811 is 2 μm to 8 μm, and the maximum width of the second opening 812 is 1.5 μm to 6 μm.

In this embodiment, the first opening 811 and the second opening 812 of the first through hole 81 are shaped as circles, ellipses, or rectangles. Furthermore, in this embodiment, the technical solutions of the present disclosure are illustrated by taking an example that the the first opening 811 and the second opening 812 of the first through hole 81 are shaped as circles.

Figure 5:
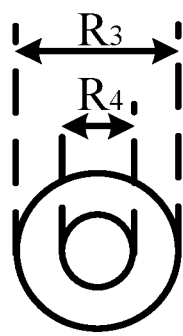
FIG. 5 is a top view of a through hole in the planarization layer of the array substrate according to an embodiment of the present disclosure.

Please refer to FIG. 3 and FIG. 5. FIG. 5 is a top view of a through hole in the planarization layer of the array substrate according to an embodiment of the present disclosure. In this embodiment, a diameter $R_3$ of the first opening 811 of the first through hole 81 away from the first substrate 10 is 2.9 μm, and a diameter $R_4$ of the second opening 812 of the first through hole 81 close to the first substrate 10 is 1.5 μm. The angle β between the sidewall of the first through hole 81 and the first substrate 10 is 74°.

Figure 4:
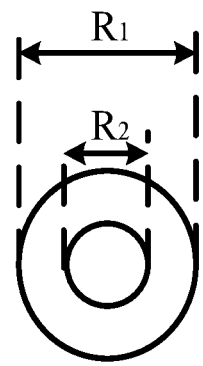
FIG. 4 is a top view of a through hole in the planarization layer of the array substrate in the prior art.

Please refer to FIG. 1, FIG. 2, FIG. 3, FIG. 4, and FIG. 5. FIG. 4 is a top view of a through hole in the planarization layer of the array substrate in the prior art.

Please refer to FIG. 1. It should be noted that in the prior art, the planarization layer 80 is usually made of an organic material. In order to connect a pixel electrode to a drain electrode, the first through holes 81 are usually formed in the planarization layer 80 by exposing and developing in the prior art. However, in the manufacturing process, due to the limitation of the material of the planarization layer 80 itself, the taper angle α of the first through holes 81 is small. Specifically, in the prior art, the planarization layer 80 is provided with a plurality of the first through holes 81. Each opening of the first through holes 81 is shaped as a circle. Please refer to FIG. 1 and FIG. 4. A diameter $R_1$ of one opening of each of the first through holes 81 away from a first substrate is 6.8 μm. A diameter $R_2$ of one opening of each of the first through holes 81 close to the first substrate is 3.1 μm. The angle a between the sidewall of each first through hole 81 and the first substrate is 43°. According to the formula for calculating an area of a circle, i.e. $S=\pi \times R^2$, an area occupied by any one of the first through holes 81 in the planarization layer 80 is 36.30 μm².

Please refer to FIG. 2, FIG. 3, and FIG. 5. In this embodiment, the planarization layer 80 is provided with a plurality of the first through holes 81. Each opening of the first through holes 81 is shaped as a circle. The diameter $R_3$ of each first opening 811 is 2.9 μm, the diameter $R_4$ of each second opening 812 is 1.5 μm, and the angle β between the sidewall of each first through hole 81 and the first substrate 10 is 74°. According to the formula for calculating an area of a circle, i.e. $S=\pi \times R^2$, an area occupied by any one of the first through holes 81 in the planarization layer 80 is 6.60 μm². Compared with the prior art, in this embodiment, the area occupied by any one of the first through holes 81 in the planarization layer 80 is reduced by 82%.

It can be understood that in this embodiment, by shaping each opening of the first through holes 81 into a circle, setting the diameter $R_3$ of the first opening 811 of each first through hole 81 away from the first substrate 10 to be 2.9

μm, setting the diameter $R_4$ of the second opening 812 of each first through hole 81 close to the first substrate 10 to be 1.5 μm, the angle β between the sidewall of each first through hole 81 and the first substrate 10 is 74°, thereby reducing the area occupied by the first through holes 81 in the planarization layer 80. This saves a space of the display panel and increases the aperture ratio of the display panel including the array substrate 1.

In this embodiment, the passivation layer 100 is provided with a second through hole 101 communicating with the first through hole 81. An angle between a sidewall of the second through hole 101 and the first substrate 10 is 50° to 90°. The second electrode layer 110 is connected to the drain electrode 72 through the first through hole 81 and the second through hole 101.

Furthermore, the angle between the sidewall of the second through hole 101 and the first substrate 10 is equal to the angle β between the sidewall of the first through hole 81 and the first substrate 10. In the direction perpendicular to the first substrate 10, a cross-section of the sidewall of the second through hole 101 is a straight line. A sum of a depth of the first through hole 81 and a depth of the second through hole 101 is 1 μm to 2.5 μm. The electrode layer 111 covers the sidewall of the second through hole 101, the sidewall of the first through hole 81, and the bottom surface of the first through hole 81. The pixel electrode 111 has a thickness of 450 Å to 520 Å. It should be noted that in this embodiment, the depth of the first through hole 81, the depth of the second through hole 101, and the thickness of the pixel electrode 111 are not specifically limited.

It can be understood that in this embodiment, the passivation layer 100 is provided with the second through hole 101 that communicates with the first through hole 81, and the angle between the sidewall of the second through hole 101 and the first substrate 10 is equal to the angle β between the sidewall of the first through hole 81 and the first substrate 10, so that the second through hole 101 and the first through hole 81 can be formed by patterning the passivation layer 100 and the planarization layer 80 with a same mask. This reduces process steps, does not increase production cost, and is suitable for large-scale production.

It can be understood that in the prior art, each opening of the first through holes 81 is shaped as a circle, the diameter $R_1$ of the opening of each first through holes 81 away from the first substrate is 6.8 μm, the diameter $R_2$ of the opening of each first through holes 81 close to the first substrate is 3.1 μm, the angle α between the sidewall of each first through hole 81 and the first substrate is 43°, which is only an example. And, in this embodiment, each opening of the first through holes 81 is shaped as a circle, the diameter $R_3$ of the first opening 811 of each first through hole 81 away from the first substrate 10 is 2.9 μm, the diameter $R_4$ of the second opening 812 of each first through hole 81 close to the first substrate 10 is 1.5 μm, and the angle β between the sidewall of each first through hole 81 and the first substrate 10 is 74°, which is only an example.

It should be noted that the array substrate 1 provided in this embodiment may be applied to a liquid crystal display panel. The liquid crystal display panel includes a plurality of spacers disposed on a side of the pixel electrode 111 away from the passivation layer 100. The array substrate 1 includes a support area. An orthographic projection of the first through holes 81 on the first substrate 10 is located outside the support area. An orthographic projection of the spacers on the first substrate 10 is located in the support area. It can be understood that in this embodiment, the orthographic projection of the first through holes 81 on the first substrate 10 is located outside the support area, and the orthographic projection of the spacers on the first substrate 10 is located in the support area, so as to prevent the spacers from being located above the first through holes 81, thereby avoiding reducing a flatness of a space where the spacers are located. This reduces a risk of light leakage caused by the liquid crystal display panel being squeezed due to instability of the spacers.

Figure 6:
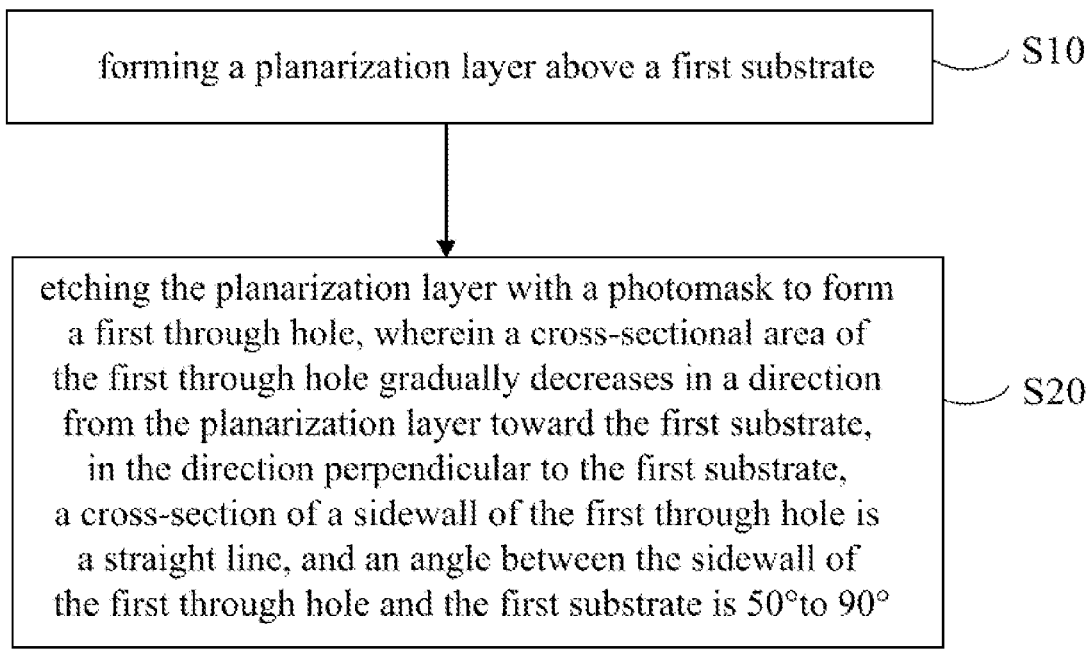
FIG. 6 is a flowchart of a method for manufacturing the array substrate according to an embodiment of the present disclosure.

Please refer to FIG. 6, which is a flowchart of a method for manufacturing the array substrate according to an embodiment of the present disclosure.

The present disclosure further a method for manufacturing the array substrate 1 includes the following steps.

Step S10: forming a planarization layer 80 above a first substrate 10.

Specifically, in this embodiment, the step S10 includes the following steps.

Step S11: forming a buffer layer 20, an active layer 30, a gate insulating layer 40, a first metal layer 50, an interlayer insulating layer 60, and a second metal layer 70 in sequence on the first substrate 10, wherein the first substrate 10 includes a first base substrate 11, a spacer layer 12, and a second base substrate 13 that are stacked in sequence, the first metal layer 50 includes, but is not limited to, a gate electrode 51, and the second metal layer 70 includes a source electrode 71 and a drain electrode 72.

Step S12: forming the planarization layer 80 on the second metal layer 70. The planarization layer 80 is made of, but is not limited to, an organic material.

Step S20: etching the planarization layer 80 with a photomask to form a first through hole 81, wherein a cross-sectional area of the first through hole 81 gradually decreases in a direction from the planarization layer 80 toward the first substrate 10, in the direction perpendicular to the first substrate 10, a cross-section of a sidewall of the first through hole 81 is a straight line, and an angle β between the sidewall of the first through hole 81 and the first substrate 10 is 50° to 90°.

Before the step S20, the method for manufacturing the array substrate 1 further includes the following step.

Figure 7A:
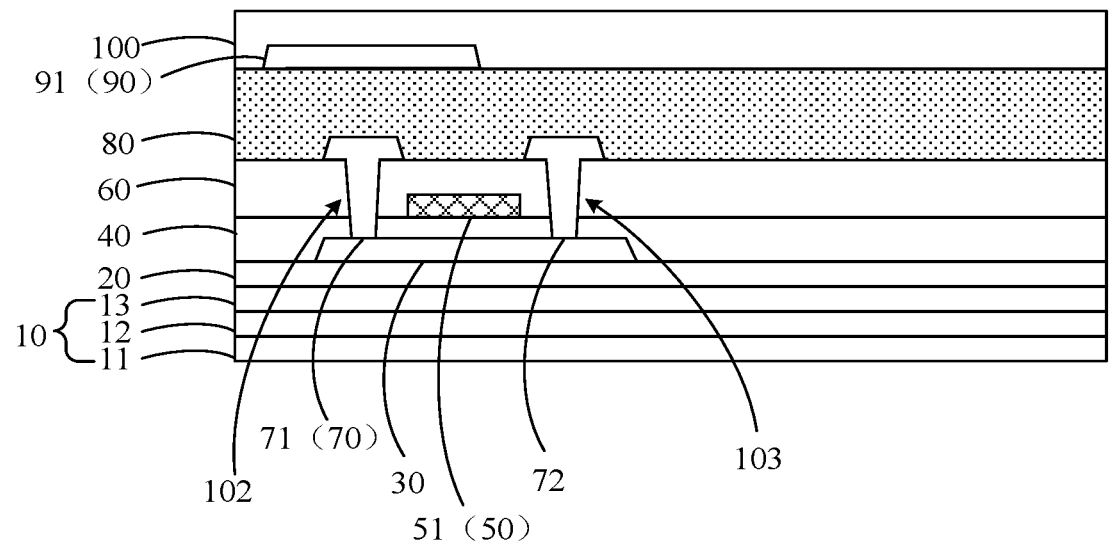
FIG. 7A to FIG. 7E are schematic structural diagrams of the array substrate during a manufacturing process according to an embodiment of the present disclosure.

Step S13: forming a first electrode layer 90 and a passivation layer 100 in sequence on the planarization layer 80, wherein the first electrode layer 90 includes, but is not limited to, a common electrode 91, as shown in FIG. 7A.

In this embodiment, the step S20 includes the following steps.

Figure 7B:
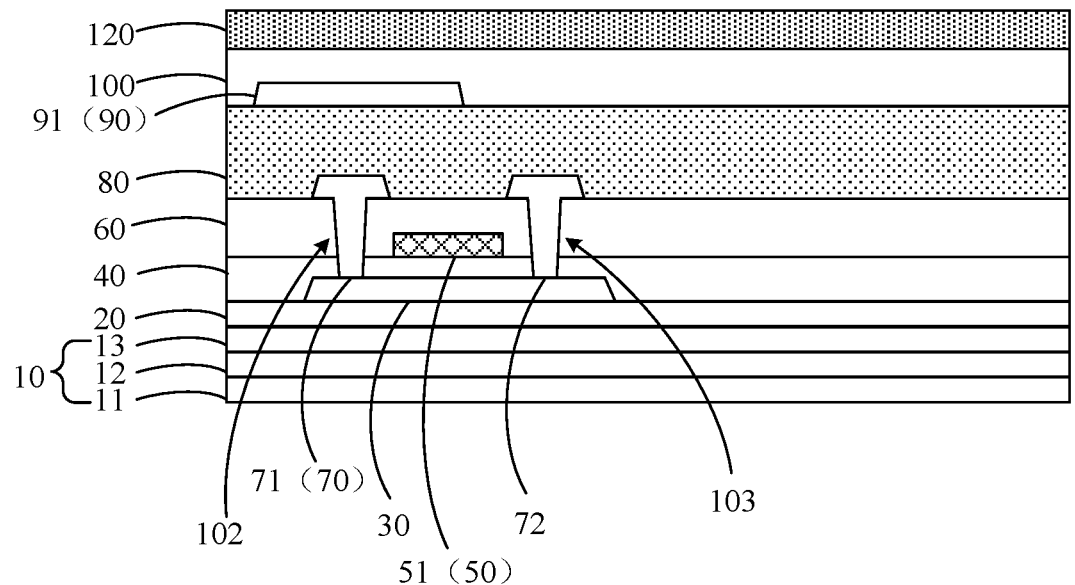

Step S21: forming a photoresist layer 120 on the passivation layer 100, as shown in FIG. 7B.

Figure 7C:
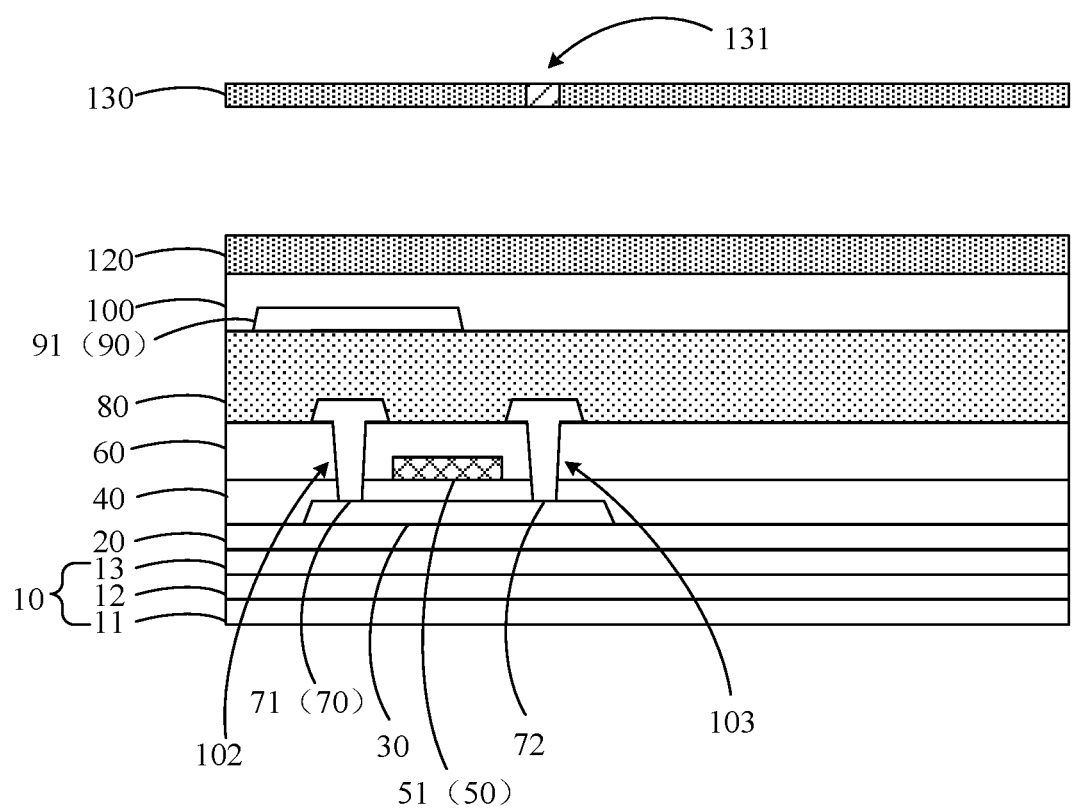

Step S22: exposing the photoresist layer 120 with a first halftone mask 130, wherein the first halftone mask 130 includes a first light-transmitting area 131, the first light-transmitting area 131 is shaped as a circle, a diameter of the first light-transmitting area 131 is 2 μm to 8 μm, as shown in FIG. 7C.

Figure 7D:
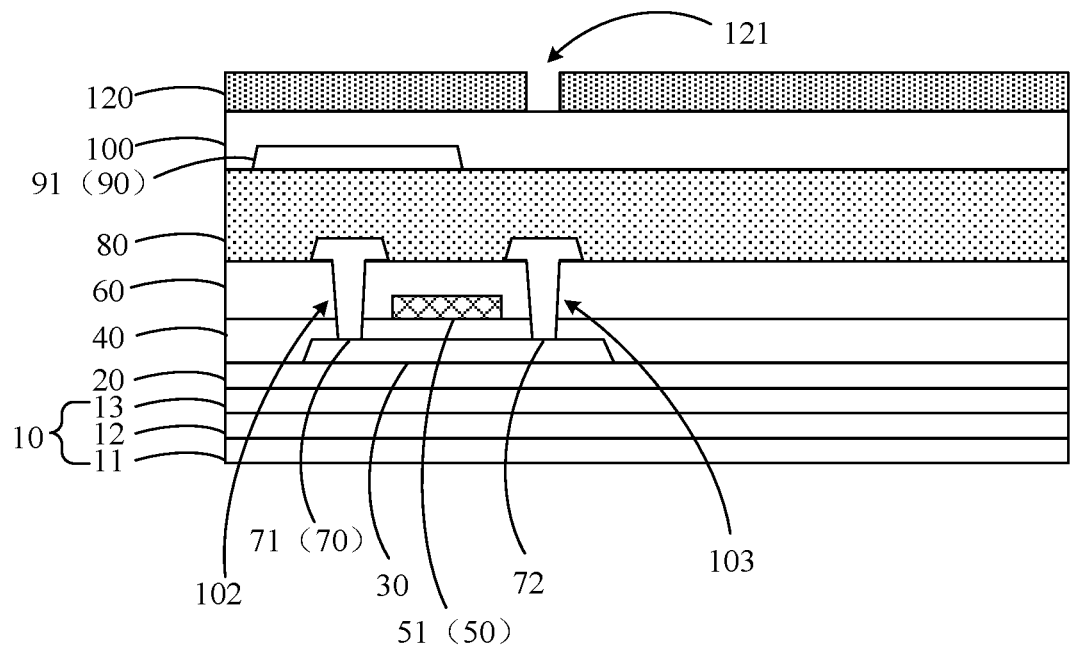

Step S23: developing the photoresist layer 120, and removing a portion of the photoresist layer 120 corresponding to the first light-transmitting area 131, so as to form a through groove 121 in the photoresist layer 120, as shown in FIG. 7D.

Figure 7E:
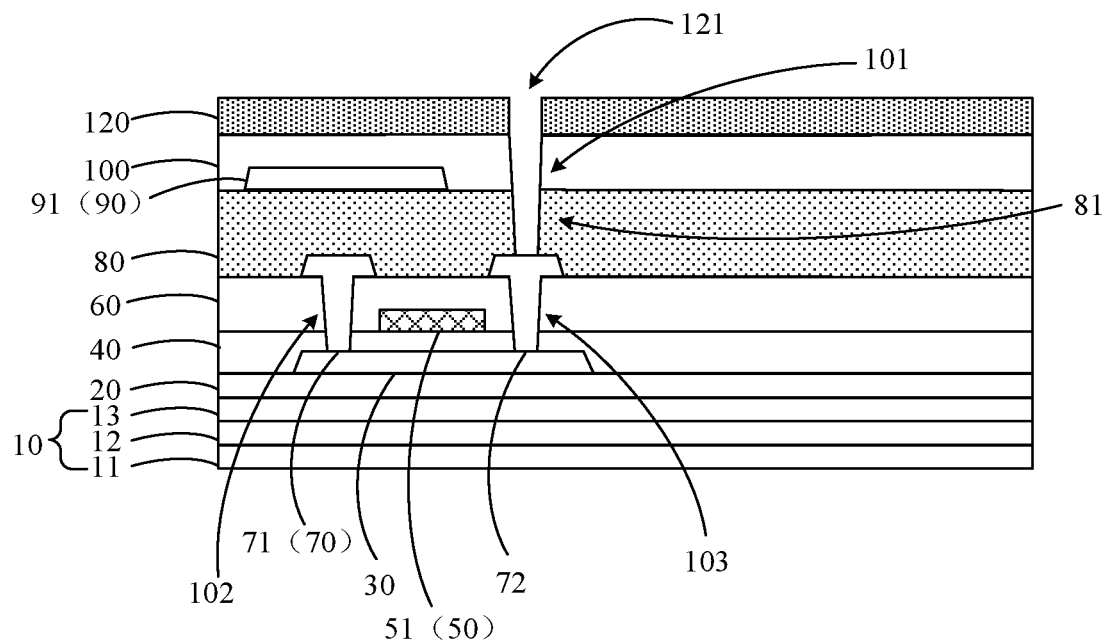

Step S24: etching a portion of the passivation layer 100 and a portion of the planarization layer 80 corresponding to the through groove 121 to form a second through hole 101 and the first through hole 81, wherein the second through hole 101 communicates with the first through hole 81, and in the direction perpendicular to the first substrate 10, a cross-section of a sidewall of the second through hole 101 is a straight line, as shown in FIG. 7E.

Step S25: peeling off a remaining portion of the photoresist layer 120.

It should be noted that in the prior art, due to a limitation of a material of the planarization layer 80 itself in a process of manufacturing an array substrate, when forming the first through hole 81 in the planarization layer 80, a diameter of an opening of the first through hole 81 close to the first substrate 10 is greater than 3 μm, which cannot meet requirements of a high pixel per inch (PPI) display device.

In the present disclosure, the photoresist layer 120 is formed on the passivation layer 100, and then the photoresist layer 120 is exposed with the first halftone mask 130, and then the photoresist layer 120 is developed, and then the portion of the photoresist layer 120 corresponding to the first light-transmitting area 131 is removed to form the through groove 121 in the photoresist layer 120, and then the portion of the passivation layer 100 and the portion of the planarization layer 80 corresponding to the through groove 121 are etched to form the second through hole 101 and the first through hole 81. Therefore, in this embodiment, a size of the through groove 121 formed in the photoresist layer 120 can be controlled by controlling a size of the first light-transmitting area 131 of the first halftone mask 130, so as to meet requirements of preparing a high pixel per inch (PPI) display device. It can be understood that exposing a photoresist material to form a through hole with a diameter of less than 2 μm belongs to the prior art, which will not be described in detail in this embodiment.

In this embodiment, the method for manufacturing the array substrate 1 further includes the following steps.

Step S30: forming a second electrode layer 110 on the passivation layer 100, wherein the second electrode layer 110 includes, but is not limited to, a pixel electrode 111, and the pixel electrode 111 is electrically connected to the drain electrode 72 through the second through hole 101 and the first through hole 81.

It can be understood that in this embodiment, the passivation layer 100 is provided with the second through hole 101 communicating with the first through hole 81, and in the direction perpendicular to the first substrate 10, the cross-section of the sidewall of the second through hole 101 is a straight line, so that the second through hole 101 and the first through hole 81 can be formed by patterning the passivation layer 100 and the planarization layer 80 with a same mask. This reduces process steps, does not increase production cost, and is suitable for large-scale production.

The present disclosure further provides a display panel. The display panel is, but is not limited to, one of a light-emitting diode (LED) display panel and an organic light-emitting diode (OLED) display panel, which is not specifically limited in this embodiment. It should be noted that in this embodiment, the technical solutions of the present disclosure is described by taking the display panel as a light emitting diode display panel as an example.

In this embodiment, the display panel includes the array substrate 1 described in any of the above embodiments, a color filter substrate disposed opposite to the array substrate 1, and a liquid crystal layer disposed between the array substrate 1 and the color filter substrate.

It can be understood that the array substrate 1 has been described in detail in the above embodiments, which will not be described in detail herein.

In this embodiment, the display panel further includes a spacer layer disposed between the array substrate 1 and the color filter substrate.

The spacer layer includes a plurality of spacer columns. The spacer columns are shaped as circular truncated cones. Furthermore, the spacer columns are disposed upside down between the array substrate 1 and the color filter substrate. That is, an end of each of the spacer columns with a larger radius is in contact with the color filter substrate, and an end of each of the spacer columns with a smaller radius is in contact with the array substrate 1, so that the spacer columns play a good supporting role.

It can be understood that in this embodiment, the cross-sectional area of the first through hole 81 gradually decreases in a direction from the planarization layer 80 toward the first substrate 10, in the direction perpendicular to the first substrate 10, the cross-section of the sidewall of the first through hole 81 is a straight line, and an angle between the sidewall of the first through hole 81 and the first substrate 10 is 50° to 90°, so that in the direction perpendicular to the first substrate 10, a cross-section of a portion of the planarization layer 80 between two adjacent first through holes 81 is a straight line. This increases the flatness of the space where the spacers are located, thereby reducing the risk of the light leakage caused by the liquid crystal display panel being squeezed due to the instability of the spacers.

In the above, the present disclosure provides an array substrate and a display panel including the same. The array substrate includes a first substrate and a planarization layer disposed on a side of the first substrate, wherein the planarization layer is provided with a first through hole, a cross-sectional area of the first through hole gradually decreases in a direction from the planarization layer toward the first substrate, and an angle between a sidewall of the first through hole and the first substrate is 50° to 90°. In the present disclosure, by setting the cross-sectional area of the first through hole to gradually decrease in the direction from the planarization layer toward the first substrate, and setting the angle between the sidewall of the first through hole and the first substrate to be 50° to 90°, an area occupied by the first through hole in the planarization layer is reduced, thereby increasing an aperture ratio of the display panel.

It should be understood that those skilled in the art may make equivalent replacements or changes based on the technical solutions and inventive concepts of the present application, and all such changes or replacements shall fall within the scope of the claims of the present application.

What is claimed is:

1. An array substrate, comprising:
   a first substrate;
   a planarization layer disposed on a side of the first substrate and provided with a first through hole, wherein a cross-sectional area of the first through hole gradually decreases in a direction from the planarization layer toward the first substrate, and an angle between a sidewall of the first through hole and a bottom surface of the first through hole is 50° to 90°; and
   a passivation layer disposed on a side of the planarization layer away from the first substrate and provided with a second through hole communicating with the first through hole, wherein an angle between a sidewall of the second through hole and a plane parallel to an upper surface of the first substrate is 50° to 90°;
   wherein the angle between the sidewall of the second through hole and the plane parallel to the upper surface of first substrate is equal to an angle between the sidewall of the first through hole and the plane parallel to the upper surface of first substrate.

2. The array substrate according to claim 1, wherein an angle between the sidewall of the first through hole and a side surface of the planarization layer away from the first substrate is 90° to 130°.

3. The array substrate according to claim 2, wherein the sidewall of the first through hole comprises a first portion, and in a direction perpendicular to the first substrate, a cross-section of the first portion is a straight line.

4. The array substrate according to claim 2, wherein in a direction perpendicular to the first substrate, a cross-section of the sidewall of the first through hole is a straight line.

5. The array substrate according to claim 1, wherein
the first through hole comprises a first opening away from the first substrate, and a second opening close to the first substrate; and
a ratio of a maximum width of the first opening to a maximum width of the second opening is M:N, where M is 2 to 3, and N is 3 to 4.5.

6. The array substrate according to claim 5, wherein in a direction perpendicular to the first substrate, the maximum width of the first opening is 2 μm to 8 μm, and the maximum width of the second opening is 1.5 μm to 6 μm.

7. The array substrate according to claim 1, further comprising a support area, wherein an orthographic projection of the first through hole on the first substrate is located outside the support area.

8. The array substrate according to claim 1, wherein a sum of a depth of the first through hole and a depth of the second through hole is 1 μm to 2.5 μm.

9. The array substrate according to claim 1, further comprising an electrode layer covering the sidewall of the second through hole, the sidewall of the first through hole, and the bottom surface of the first through hole.

10. A display panel, comprising an array substrate, wherein the array substrate comprises:
a first substrate;
a planarization layer disposed on a side of the first substrate and provided with a first through hole, wherein a cross-sectional area of the first through hole gradually decreases in a direction from the planarization layer toward the first substrate, and an angle between a sidewall of the first through hole and a bottom surface of the first through hole is 50° to 90°; and
wherein the array substrate further comprises a passivation layer disposed on a side of the planarization layer away from the first substrate and provided with a second through hole communicating with the first through hole, and an angle between a sidewall of the second through hole and a plane parallel to an upper surface of the first substrate is 50° to 90°;
wherein the angle between the sidewall of the second through hole and the plane parallel to the upper surface of first substrate is equal to an angle between the sidewall of the first through hole and the plane parallel to the upper surface of first substrate.

11. The display panel according to claim 10, wherein an angle between the sidewall of the first through hole and a side surface of the planarization layer away from the first substrate is 90° to 130°.

12. The display panel according to claim 11, wherein the sidewall of the first through hole comprises a first portion, and in a direction perpendicular to the first substrate, a cross-section of the first portion is a straight line.

13. The display panel according to claim 11, wherein in a direction perpendicular to the first substrate, a cross-section of the sidewall of the first through hole is a straight line.

14. The display panel according to claim 10, wherein
the first through hole comprises a first opening away from the first substrate, and a second opening close to the first substrate; and
a ratio of a maximum width of the first opening to a maximum width of the second opening is M:N, where M is 2 to 3, and N is 3 to 4.5.

15. The display panel according to claim 14, wherein in a direction perpendicular to the first substrate, the maximum width of the first opening is 2 μm to 8 μm, and the maximum width of the second opening is 1.5 μm to 6 μm.

16. The display panel according to claim 10, wherein the array substrate further comprises a support area, and an orthographic projection of the first through hole on the first substrate is located outside the support area.

* * * * *